United States Patent
Hu et al.

(10) Patent No.: US 9,618,585 B2
(45) Date of Patent: Apr. 11, 2017

(54) ADJUSTING DEVICE OF AN OUTPUT VOLTAGE OF A SWITCH POWER SUPPLY, AN ADJUSTING METHOD THEREOF AND AN INTEGRATED CHIP

(71) Applicant: DELTA ELECTRONICS POWER (DONG GUAN) CO., LTD., Guangdong Province (CN)

(72) Inventors: Xiangrong Hu, Guangdong Province (CN); Liuqun Xie, Guangdong Province (CN); Weicheng Tan, Guangdong Province (CN)

(73) Assignee: DELTA ELECTRONICS POWER (DONG GUAN) CO., LTD. (CN)

( * ) Notice: Subject to any disclaimer, the term of this patent is extended or adjusted under 35 U.S.C. 154(b) by 253 days.

(21) Appl. No.: 14/260,396

(22) Filed: Apr. 24, 2014

(65) Prior Publication Data

US 2015/0015218 A1 Jan. 15, 2015

(30) Foreign Application Priority Data

Jul. 11, 2013 (CN) .......................... 2013 1 0292081

(51) Int. Cl.
*G01R 31/40* (2014.01)
*H02M 3/157* (2006.01)
(Continued)

(52) U.S. Cl.
CPC ............ *G01R 31/40* (2013.01); *H02M 3/157* (2013.01); *H02M 3/33515* (2013.01); *H02M 2001/0025* (2013.01)

(58) Field of Classification Search
CPC ............... G01R 19/16538; G01R 31/40–31/42
See application file for complete search history.

(56) References Cited

U.S. PATENT DOCUMENTS 4,646,218 A * 2/1987 Scholer ............. H02M 3/33523
363/131
6,535,408 B2 3/2003 Lin et al.
(Continued)

FOREIGN PATENT DOCUMENTS

CN 201674406 U * 12/2010
CN 202906767 4/2013
(Continued)

OTHER PUBLICATIONS

Office Action dated Jan. 30, 2015 from corresponding No. TW 102129576.
(Continued)

*Primary Examiner* — Patrick Assouad
*Assistant Examiner* — Demetrius Pretlow
(74) *Attorney, Agent, or Firm* — Hauptman Ham, LLP

(57) ABSTRACT

An adjusting device of an output voltage of a switch power supply and an adjusting method are provided. The adjusting device includes a potential setting module generating a high level signal and an adjustor being connected to the potential setting module to receive the high level signal. The adjustor includes a signal emitting module and a comparison module. The signal emitting module emits a pulse drive signal to the switch power supply when receiving the high level signal. The switch power supply automatically adjusts the output voltage when receiving the pulse drive signal. The comparison module reads the output voltage, compares with a preset voltage, and adjusts the output voltage according to a comparison result. The switch power supply can stop the automatic adjustment when an output level of a switch port of the switch power supply is inverted. An integrated chip is also provided.

11 Claims, 6 Drawing Sheets

(51) Int. Cl.
*H02M 3/335* (2006.01)
*H02M 1/00* (2006.01)

(56) References Cited

U.S. PATENT DOCUMENTS

| | | | | |
|---|---|---|---|---|
| 7,173,408 | B2 | 2/2007 | Huang | |
| 7,486,767 | B2* | 2/2009 | Sonobe | A61B 6/105 |
| | | | | 378/191 |
| 2003/0031034 | A1* | 2/2003 | Rodriguez | H02M 3/285 |
| | | | | 363/45 |
| 2005/0017707 | A1* | 1/2005 | Ramesh | G01R 31/40 |
| | | | | 324/102 |
| 2009/0134816 | A1* | 5/2009 | Sloan | H05B 33/083 |
| | | | | 315/307 |
| 2010/0149712 | A1* | 6/2010 | Wang | H02M 3/33515 |
| | | | | 361/93.2 |
| 2012/0049823 | A1* | 3/2012 | Chen | H02M 1/36 |
| | | | | 323/282 |
| 2013/0113449 | A1* | 5/2013 | Pietri | H02M 3/156 |
| | | | | 323/283 |
| 2013/0129367 | A1* | 5/2013 | Jeong | H02M 3/33507 |
| | | | | 399/37 |

FOREIGN PATENT DOCUMENTS

| | | |
|---|---|---|
| TW | I277851 | 4/2007 |
| TW | I369600 | 8/2012 |

OTHER PUBLICATIONS

Office Action (Cover Page) dated Dec. 3, 2014 from corresponding No. CN 201310292081.2.

\* cited by examiner

ADJUSTING DEVICE OF AN OUTPUT VOLTAGE OF A SWITCH POWER SUPPLY, AN ADJUSTING METHOD THEREOF AND AN INTEGRATED CHIP

BACKGROUND OF THE INVENTION

1. Field of the Invention

The present invention relates to an electric technique field, and more particularly to an adjusting device of an output voltage of a switch power supply, an adjusting method thereof and an integrated chip.

2. Description of the Prior Art

With the increasing use of computer equipment, a computer system requires a switch power supply to be capable of providing a stable and precise supply voltage. The supply voltage is not allowed to beyond a required voltage range, otherwise the computer system will automatically shut down, and even easily burn out. Therefore, most of the switching power supplies dispose an output voltage-adjusting module. When the output voltage varies, it may be automatically adjusted by the electrical circuit characteristic.

In the manufacturing process of the switch power supply, an output voltage point is set by adjusting the value of a variable resistor, and is fixed by glue dispensing method after setting. The traditional method of setting and testing the output voltage point is as follows: the first step is setting a current range and a voltage range of a DC electronic load, the second step is connecting the switch power supply to the DC electronic load, the third step is tuning the variable resistor until the output voltage of the product reaches the preset voltage range of the DC electronic load, and to finish the adjustment when the DC electronic load displays "PASS", and the fourth step is dispensing glue on one point of the variable resistor to prevent the variation of the variable resistor.

However, every operation step above is performed by manual operation, seriously blocking the improvement of productivity. Moreover, the glue dispensed on the variable resistor can easily expand with heat and contract with cold when drying, so the fixed variable resistor may be varied and the set output voltage point may be displaced. This will seriously influence the product quality.

BRIEF SUMMARY OF THE INVENTION

One object of the present invention is to solve the above questions, and to provide an adjusting device of an output voltage of a switch power supply, wherein the adjusting device can automatically adjust an output voltage by transmitting a high level signal generated by a potential setting module to an adjustor for driving the switch power supply, and can achieve full automatic operation, save manpower on product manufacture, and greatly enhance productivity, and because the switch power supply employs a digital variable resistor located on a built-in integrated chip to adjust resistance, thereby enhancing the adjusting precision and ensuring the quality of the product.

To solve the above questions, the present invention provides an adjusting device of an output voltage of a switch power supply. The adjusting device comprises a potential setting module being used to generate a high level signal; and an adjustor being connected to the potential setting module and being used to receive the high level signal. The adjustor comprises a signal emitting module and a comparison module. The signal emitting module emits a pulse drive signal to the switch power supply when receiving the high level signal. The switch power supply automatically adjusts the output voltage when receiving the pulse drive signal. The comparison module is used to read the output voltage of the switch power supply, compare with a preset voltage, and adjust the output voltage of the switch power supply according to a comparison result. The switch power supply can stop the automatic adjustment when an output level of a switch port of the switch power supply is inverted.

Further, the adjustor further comprises a target voltage setting module, which is used to set the preset voltage of the switch power supply for being read by the comparison module.

Further, the switch power supply further comprises an input port, an integrated chip and an output module. The input port is used to receive the pulse drive signal and then transmit to the integrated chip. The integrated chip is electrically connected to the input port and the output module. The integrated chip comprises a judgment module, which is used to judge whether the received pulse drive signal is correct. When the judgment module judges the received pulse drive signal to be correct, the switch power supply will automatically adjust the output voltage. The output module is connected to the comparison module for outputting the adjusted output voltage of the switch power supply.

Further, wherein the switch port is electrically connected to the comparison module of the adjustor, when the comparison module judges that the output voltage of the switch power supply is equal to a preset voltage, the output level of the switch port will be inverted.

Further, the integrated chip further comprises a digital variable resistor, which is used to adjust the output voltage of the switch power supply by varying resistance thereof.

Further, the digital variable resistor comprises multi-group parallel resistors, each group of which includes a resistor and a fuse in series.

To solve the above questions, the present invention also provides an adjusting method of an output voltage of a switch power supply. The adjusting method comprises the following steps of: emitting a pulse drive signal to the switch power supply; receiving and transmitting the pulse drive signal to a judgment module of the switch power supply through an input port of the switch power supply; judging whether the pulse drive signal is correct by the judgment module; if correct, the switch power supply starting to automatically adjust the output voltage, and if incorrect, the judgment module emitting a warning signal to an adjustor for driving the adjustor to warn; reading the output voltage of the switch power supply in the automatic adjustment and comparing with a preset voltage by a comparison module of the adjustor, and then adjusting the output voltage of the switch power supply according to the comparison result; and stopping the automatic adjustment of the switch power supply when an output level of a switch port of the switch power supply is inverted.

Further, before the step of emitting a pulse drive signal to the switch power supply, the adjusting method further comprises the following steps of: setting the preset voltage of the switch power supply in a target voltage setting module of the adjustor; and generating a high level signal and transmitting to the adjustor by a potential setting module.

Further, after the step of stopping the automatic adjustment of the switch power supply, the adjusting method further comprises the following step of: informing that the adjustment of the output voltage of the switch power supply being successful and waiting for performing other electrical test processes when the output level of the switch port is less than a threshold value.

Further, the pulse drive signal ceases being input when the output level of the switch port of the switch power supply is inverted.

Further, the threshold value is 0.4V.

To solve the above questions, the present invention also provides an integrated chip. The integrated chip is disposed in a switch power supply, and comprises a digital variable resistor being used to adjust an output voltage of the switch power supply by varying resistance thereof.

Further, the integrated chip comprises a judgment module, which is electrically connected to an input port of the switch power supply for receiving a pulse drive signal transmitted from the input port and judging whether the pulse drive signal is correct. When the pulse drive signal is judged to be correct, the switch power supply will start to automatically adjust the output voltage. The integrated chip is electrically connected to a comparison module of an external adjustor through an output module of the switch power supply for outputting the output voltage of the switch power supply. The integrated chip is electrically connected to the comparison module of the adjustor through a switch port of the switch power supply. When the comparison module judges that the output voltage of the switch power supply is equal to a preset voltage, an output level of the switch port will be inverted.

The advantages of the prevent invention are that: the potential setting module can be employed to produce a high level when testing the switch power supply, and the adjustor can be employed to drive the switch power supply to automatically adjust the output voltage. Therefore, the present invention can achieve full automatic operation, save manpower on product manufacture, and greatly enhance productivity. Moreover, because the present invention employs the integrated chip built-in the switch power supply to adjust the output voltage of the switch power supply. Further, the present invention employs the digital variable resistor to adjust the resistance, thereby enhancing the adjusting precision of the output voltage of the switch power supply and ensuring the quality of the product.

Figure 1:
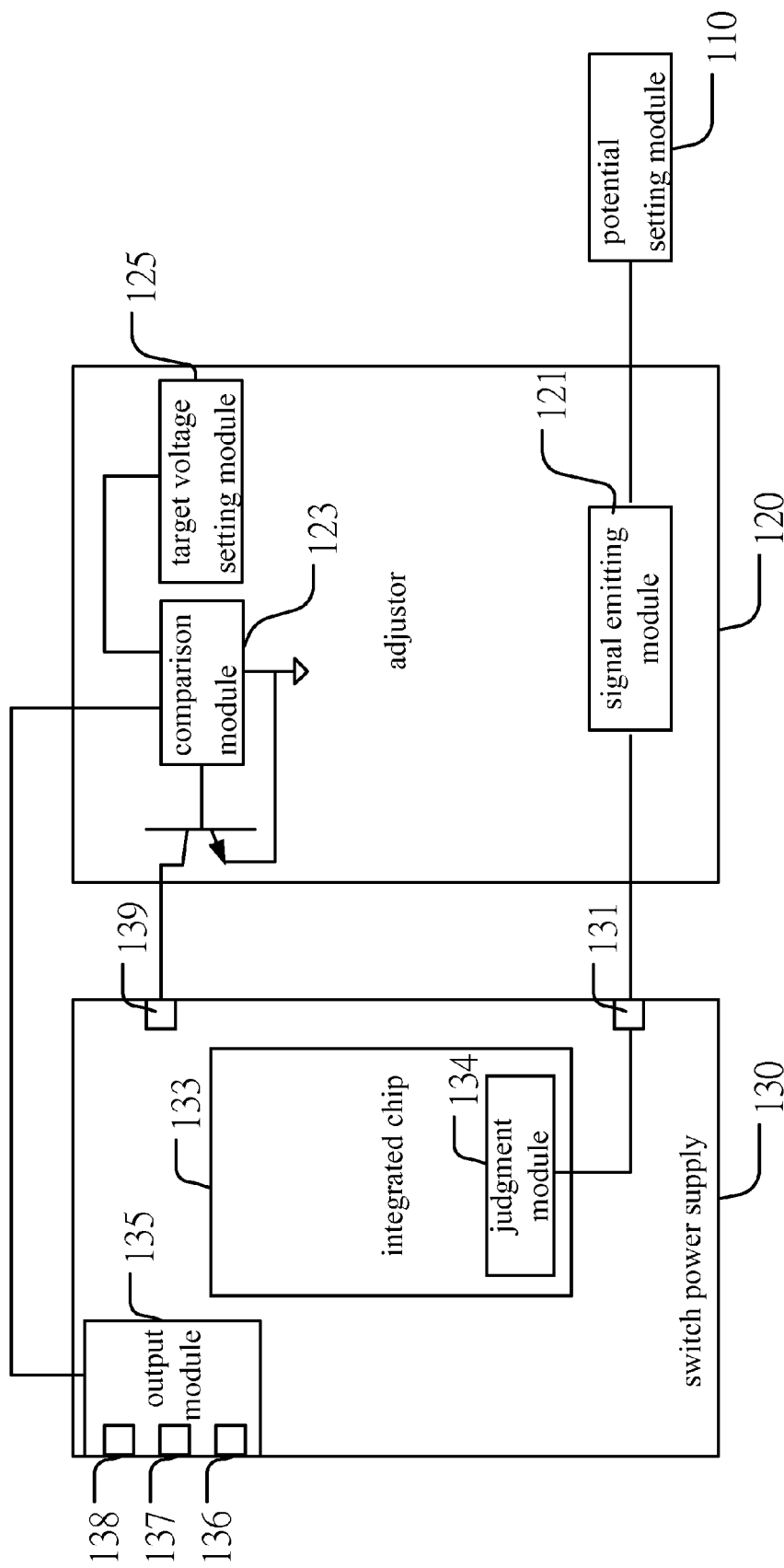
FIG. 1 is a structure schematic view of an adjusting device of an output voltage of a switch power supply.

The reference numerals in the drawings are described as follows:
110 a potential setting module
120 an adjustor
121 a signal emitting module
123 a comparison module
125 a target voltage setting module
130 a switch power supply
131 an input port
133 an integrated chip
134 a judgment module
135 an output module
136 a first output port
137 a second output port
138 a third output port
139 a switch port
210 a digital variable resistor
211 a resistor
213 a fuse

DETAILED DESCRIPTION OF THE PREFERRED EMBODIMENTS

The following description of every embodiment with reference to the accompanying drawings is used to exemplify a specific embodiment, which may be carried out in the present invention.

Figure 2:
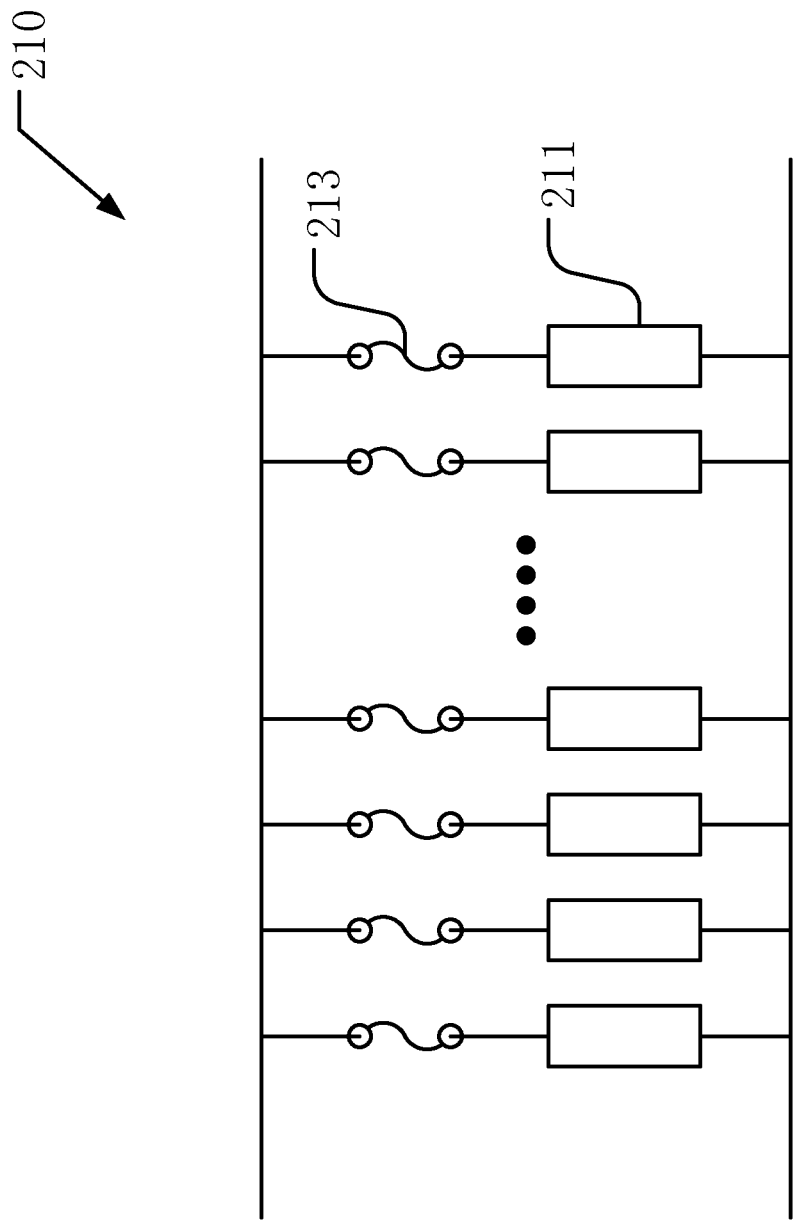
FIG. 2 is a schematic view of a digital variable resistor of the present invention.
Figure 3:
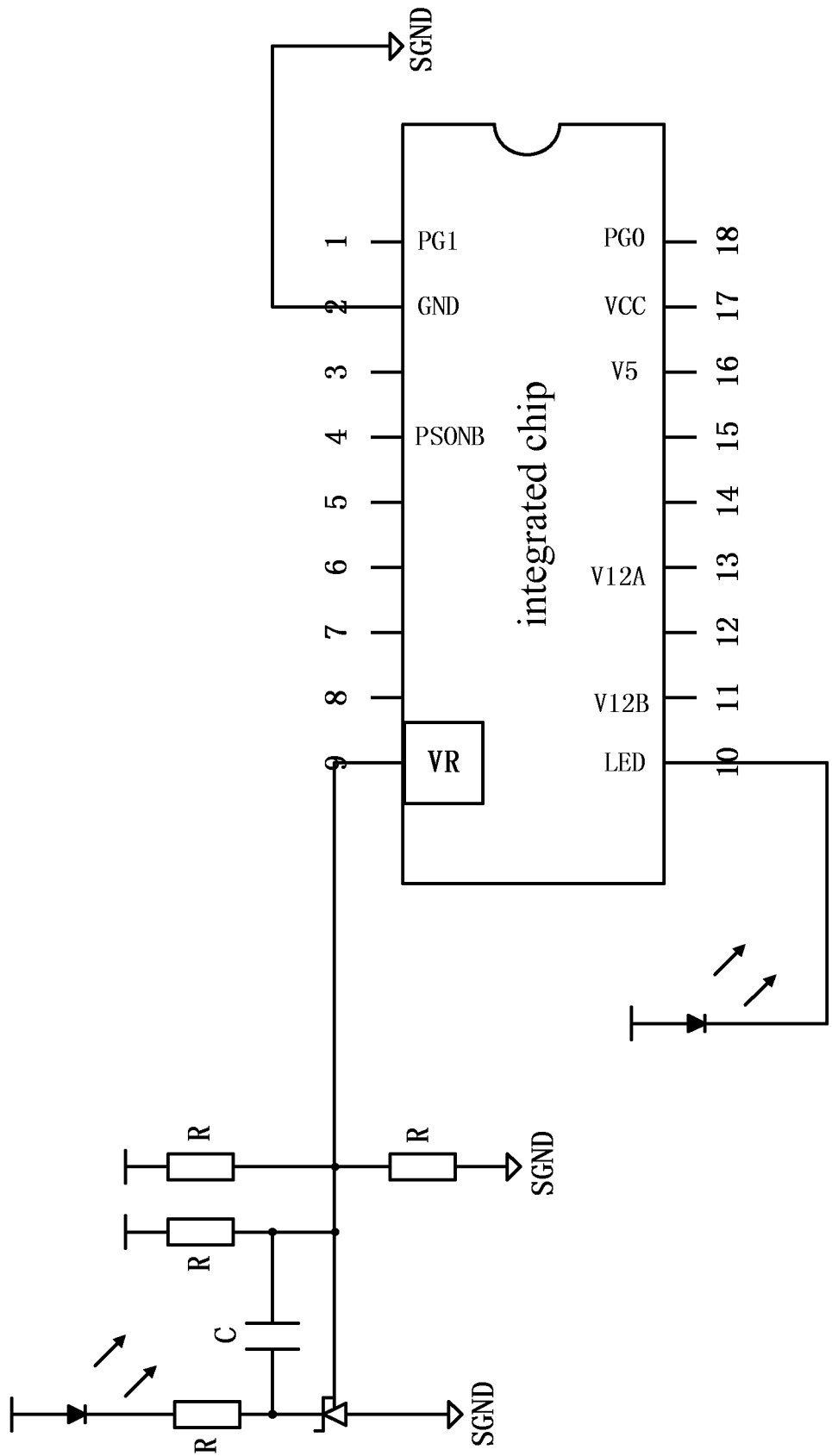
FIG. 3 is a schematic view of an integrated chip of the present invention.

FIG. 1 is a structure schematic view of an adjusting device of an output voltage of a switch power supply, FIG. 2 is a schematic view of a digital variable resistor of the present invention, and FIG. 3 is a schematic view of an integrated chip of the present invention.

Please refer to FIG. 1, the adjusting device of the present invention comprises a potential setting module 110, an adjustor 120 and a switch power supply 130.

The potential setting module 110 may be disposed in an ATE (Automatic Test Equipment). The potential setting module 110 is used to generate a high level signal and transmits it to an adjustor 120. In a specific embodiment of the present invention, a built-in program of the potential setting module 110 can control the potential setting module 110 to generate a TTL (Transistor Transistor Logic) high level signal for triggering the process of testing an output voltage of the switch power supply. By the way of setting the TTL high level signal, the ATE is capable of distinguishing between performing a program of adjusting the output voltage of the switch power supply and performing other electrical test processes. Moreover, the TTL high level signal also can serve as a control signal of a pulse drive signal emitted by the adjustor 120.

The adjustor 120 is connected to the potential setting module 110, and comprises a signal emitting module 121 and a comparison module 123. The signal emitting module 121 is used to emit one pulse drive signal to the switch power supply 130 after receiving the high level signal. The pulse drive signal may be produced by the TTL high level signal emitted by the potential setting module 110 or directly generated by the adjustor 120. In the preferred embodiment of the present invention, the adjustor 120 further comprises a target voltage setting module 125, which is used to set a preset voltage of the switch power supply 130 for being read by the comparison module 123. The preset voltage may be 12V, 5V, or 3.7V, which can be determined according to the practical needs of the different manufacturers. In other embodiments, the preset voltage of the switch power supply 130 can be defaulted and need not be read from the target voltage setting module 125. The comparison module 123 is used to read the output voltage of the switch power supply 130 during the automatic adjust process and compare the output voltage with the preset voltage.

The switch power supply 130 comprises an input port 131, an integrated chip 133, an output module 135, and a switch port 139. The switch power supply 130 drives the integrated chip 133 to work according to the preset voltage set by the adjustor 120 for automatically adjusting the output voltage, after receiving the pulse drive signal. The integrated chip 133 does not stop working and the switch power supply 130 does not stop the automatic adjustment operation, until an output level of the switch port 139 of the switch power supply 130 is inverted.

The input port 131 is disposed on the switch power supply 130 to receive the pulse drive signal and then transmits it to the integrated chip 133. The switch power supply 130 can control the built-in integrated chip 133 to work by the pulse drive signal, thereby automatically adjusting the output voltage of the switch power supply 130. Please refer to FIGS. 1 and 3. The input port 131 is a PSONB port, which is electrically connected to a PSONB pin of a protection control chip, i.e. a housekeeping chip. By the input port 131 having a longer delay time, a serial of the pulse drive signals are added into the delay time for prompting the integrated chip 133 to start to work, and automatically adjusting the output voltage of the switch power supply 130. When the input port 131 is under the state of unworking time, the input port 131 also receives the pulse drive signals. In practice, the built-in integrated chip 133 of the switch power supply 130 only has two adjustment chances. If needing a third adjustment, the switch power supply 130 needs to replace the integrated chip 133. The pulse drive signal generally has two kinds. A first kind of the pulse drive signal, for example, a three-square-waves pulse drive signal, is a first normal trigger adjustment signal. When the production line begins afresh to test one bad switch power supply 130, it also needs to go on an ATS (Auto Test System) test, but the ATS test program of the production line can not be changed. Therefore, in order not to let the integrated chip 133 to be adjusted again and in order to keep a second adjustment chance of the integrated chip 133, it needs to provide a second kind of the pulse drive signal, for example, a five-square-waves pulse drive signal, to the integrated chip 133, but the second kind of the pulse drive signal can not trigger the switch power supply 130 to automatically adjust the output voltage.

The integrated chip 133 is electrically connected to the input port 131 and the output module 135. The integrated chip 133 comprises a judgment module 134, which is used to judge whether the received pulse drive signal is correct. When the judgment module 134 judges the pulse drive signal to be correct, the integrated chip 133 will start to adjust the resistor, thereby automatically adjusting the output voltage of the output module 135 of the switch power supply 130.

The switch port 139 is disposed on the switch power supply 130, and is electrically connected to the comparison module 123 of the adjustor 120. When the output voltage of the switch power supply 130 is equal to the preset voltage by the judgment of the comparison module 123, the output level of the switch port 139 can be inverted. Namely, the output level of the switch port 139 is converted from the high level to the low level, and the switch port 139 transmits a signal to show the finish of the automatic adjustment of the output voltage of the switch power supply 130. Further, the comparison module 123 reads the output voltage of the switch power supply 130 in the automatic adjustment, and compares the output voltage with the preset voltage. The output voltage of the switch power supply 130 will be adjusted according to the comparison result. When the output level of the switch port 139 of the switch power supply 130 is inverted, the integrated chip 133 will finish working, the switch power supply 130 will stop the automatic adjustment operation and the switch port 138 will transmit the signal to a display light of the adjustor 120 or a potential displaying module (not shown in all FIGS.) for showing the finish of the automatic adjustment. The potential displaying module may be disposed in the ATE. The potential displaying module is electrically connected to the switch port 139 for display the output level of the switch port 139. The signal is provided by the switch port 139, which can reflect whether the output voltage of the switch power supply 130 is adjusted successfully. Please refer to FIGS. 1 and 3. The switch port 139 is a port PG0, which is electrically connected to a pin PG0 of the protection control chip. If the output level of the switch port 139 is a low level (e.g. the output voltage is less than a threshold value), this shows that the automatic adjustment is successful and the switch power supply 130 is qualified. If the output level of the switch port 139 is still a high level (e.g. the output voltage is greater than or equal to a threshold value) in the given time of finishing the automatic adjustment, this shows that the automatic adjustment is unsuccessful and the switch power supply 130 is unqualified, and then it needs a failure analysis, does not need the subsequent adjustment, and informs that the ATE will exit the testing process of the output voltage.

The output module 135 is disposed on the switch power supply 130, and is electrically connected to the comparison module 123 of the adjustor 120 for outputting the output voltage of the switch power supply after being automatically adjusted. In the specific embodiment of the present invention, the comparison module 123 is a comparator. When the output voltage of the output module 135 is equal to the preset voltage set by the target voltage setting module 125, a triode of the comparator will conduct electricity, the switch port 139 will short circuit to ground, and the output level of the switch port 139 will be a low level.

In the embodiment of the present invention, the integrated chip 133 further comprises a digital variable resistor 210, which is used to adjust the output voltage of the switch power supply 130 by varying resistance, and is shown in FIGS. 2 and 3. The digital variable resistor 210 comprises multi-group parallel resistors, each group of which includes a resistor 211 and a fuse 213 in series. Namely, a first resistor is in series with a first fuse. Then the first resistor and the first fuse in series are in parallel with a second resistor and a second fuse in series, and then are in parallel with a third resistor and a third fuse in series, and so on. The output voltage of the traditional switch power supply is acquired by tuning the variable resistor to vary resistance. In the specific embodiment of the present invention, the resistance is adjusted by the fuse 213. The fuse 213 has two states (e.g. fused and non-fused, namely disconnect and conduction), so the corresponding digital signal also has two states (e.g. 1 or 0). The more the parallel resistors of the digital variable resistor 210 are disposed, the more accurate the total equivalent resistance of the digital variable resistor 210 will become. Therefore, the output voltage of the output module 135 of the switch power supply 130 has higher precision, and the product quality is greatly improved. In practice, first, it needs to set all of the multi-group parallel resistors of the digital variable resistor 210 to be all conducting electricity, now the total equivalent resistance of the digital variable resistor 210 will be relatively smaller and the output voltage of the switch power supply 130 will be larger. Meanwhile, the output voltage of the switch power supply 130 is set to be larger than the preset voltage, and next when adjusting the output voltage, the fuse 213 will be fused, the equivalent resistance of the digital variable resistor 210 will become larger, and the output voltage of the switch power supply 130 will become smaller. Hence the output voltage of the output module may be adjusted to gradually reach the preset voltage, thereby completing the automatic adjustment of the output voltage of the switch power supply 130. In addition to the fuse 213, other embodiments of the present invention may employ a switch or other ways to adjust the resistance.

In the specific embodiment of the present invention, the output module 135 includes a first output port 136, a second output port 137, and a third output port 138. The first output port 136 is used to output a first output voltage, which can serve as the output voltage of the switch power supply 130. The second output port 137 is used to output a second output voltage, which can serve as the output voltage of the switch power supply 130. The third output port 138 is used to output a third output voltage, which can serve as the output voltage of the switch power supply 130. Please refer to FIGS. 1 and 3. The thirteenth pin of the protection control chip (e.g. the integrated chip) outputs the first output voltage, e.g. 12V, through the first output port 136 of the switch power supply 130. The sixteenth pin of the protection control chip outputs the second output voltage, e.g. 5V, through the second output port 137 of the switch power supply 130. The eleventh pin of the protection control chip outputs the third output voltage, e.g. 12V, through the third output port 138 of the switch power supply 130. In practice, only one port of the first, second, and third output ports may be generally used. The multiple ports disposed in the output module 135 enable the output voltage of the switch power supply 130 to be adjusted to different values, thereby meeting the different requirements of different users for the output voltage of the switch power supply.

Figure 4:
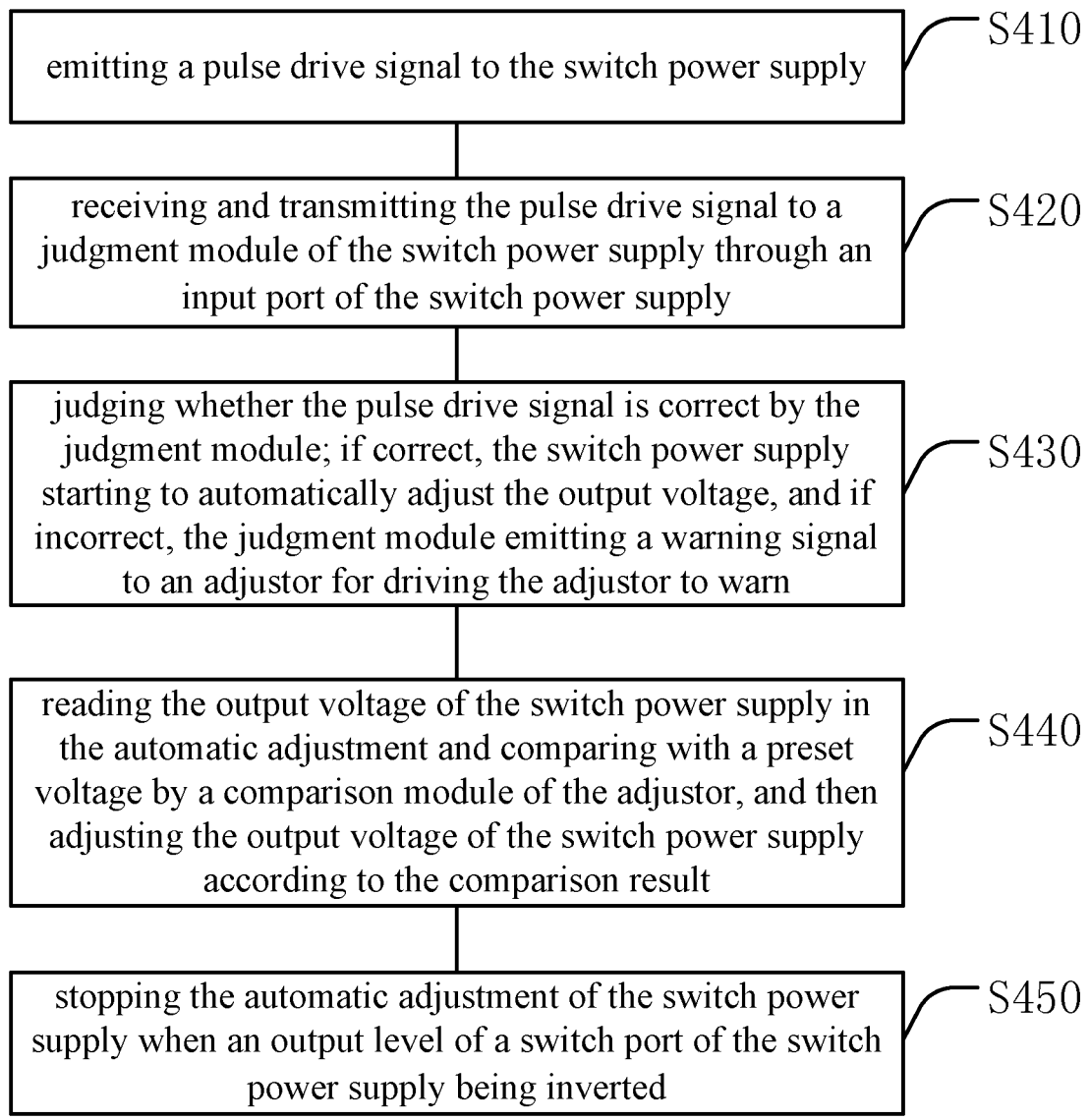
FIG. 4 is a flow chart of a method of adjusting an output voltage of a switch power supply in the present invention.

On the other hand, the present invention also provides an adjusting method of an output voltage of a switch power supply, which employs the adjusting device of the output voltage of the switch power supply. Referring to FIG. 4, the adjusting method comprises the following steps of: S410, emitting a pulse drive signal to the switch power supply; S420, receiving and transmitting the pulse drive signal to a judgment module of the switch power supply by an input port of the switch power supply; S430, judging whether the pulse drive signal is correct by the judgment module, if correct, the switch power supply will start to automatically adjust the output voltage, and if incorrect, the judgment module will emit a warning signal to an adjustor for driving the adjustor to warn; S440, reading the output voltage of the switch power supply in the automatic adjustment and comparing with a preset voltage by a comparison module of the adjustor, and then adjusting the output voltage of the switch power supply according to the comparison result; and S450, stopping the automatic adjustment of the switch power supply when an output level of a switch port of the switch power supply is inverted.

The following text gives a detail description for the above steps.

The step S410 is emitting the pulse drive signal to the switch power supply.

Wherein the pulse drive signal may be directly generated by the adjustor or generated by a TTL high level signal emitted by a potential setting module. After generating the pulse drive signal, the pulse drive signal is transmitted to the input port of the switch power supply.

The step S420 is receiving and transmitting the pulse drive signal to the judgment module of the switch power supply through the input port of the switch power supply.

The step S430 is judging whether the pulse drive signal is correct by the judgment module. If correct, the switch power supply will start to automatically adjust the output voltage, and if incorrect, the judgment module will emit the warning signal to the adjustor for driving the adjustor to warn.

The judgment module is disposed in an integrated chip of the switch power supply, and can judge whether the pulse drive signal transmitted from the adjustor is correct. If the judgment module judges the received pulse drive signal to be a first kind of the pulse drive signal, for example, a three-square-waves pulse drive signal, the integrated chip will be driven to adjust resistance, thereby automatically adjusting the output voltage of the switch power supply. If the judgment module judges the received pulse drive signal to be a second kind of the pulse drive signal, for example, a five-square-waves pulse drive signal, or other kinds of the pulse drive signals, the integrated chip will not work. Namely, the output voltage of the switch power supply can not be automatically adjusted. Meanwhile, the judgment module will emit the warning signal to the adjustor for driving the adjustor to warn and enabling an amplifier of the adjustor to be opened.

The step S440 is reading the output voltage of the switch power supply in the automatic adjustment and comparing with the preset voltage by the comparison module of the adjustor, and then adjusting the output voltage of the switch power supply according to the comparison result.

When the judgment module judges the received pulse drive signal to be a first kind of the pulse drive signal, the integrated chip will be driven to adjust the resistance, thereby automatically adjusting the output voltage of the switch power supply. In the specific embodiment of the present invention, the integrated chip further includes a digital variable resistor, which is used to adjust the output voltage of the switch power supply by varying the resistance. The digital variable resistor comprises multi-group parallel resistors, each group of which includes a resistor and a fuse in series. Therefore, the comparison module may further adjust the digital variable resistor for adjusting the output voltage of the switch power supply according to the comparison result between the output voltage of the output module after adjusting the digital variable resistor and the preset voltage set by a target voltage setting module.

The step S450 is stopping the automatic adjustment of the switch power supply when the output level of the switch port of the switch power supply is inverted.

In the specific embodiment of the present invention, the output module includes a first output port, a second output port, and a third output port. The first output port is used to output a first output voltage, which can serve as the output voltage of the switch power supply. The second output port is used to output a second output voltage, which can serve as the output voltage of the switch power supply. The third output port is used to output a third output voltage, which can serve as the output voltage of the switch power supply. In practice, only one port of the first, second and third output ports may be generally used. The multiple ports disposed in the output module enable the output voltage of the switch power supply to be adjusted to different values, thereby meeting the different requirements of different users for the output voltage of the switch power supply.

In the embodiment of the present invention, the comparison module is a comparator. When the comparison module judges that the output voltage of the switch power supply is equal to the preset voltage, a triode of the comparator will conduct electricity, the switch port will short circuit to ground, and the output level of the switch port 139 will be inverted from the original high level to the low level. The integrated chip stops adjusting the resistance. Namely, the switch power supply stops the automatic adjustment operation.

Before the step S410, the method further comprises the following steps:

A step 1) is setting the preset voltage of the switch power supply in the target voltage setting module of the adjustor.

By employing the target voltage setting module, the output voltage of the switch power supply can be automatically adjusted to be the preset voltage, e.g. 12V, 5V, or 3.7V. Generally, each production only needs to be set once.

A step 2) is generating the high level signal and transmitting it to the adjustor by the potential setting module.

By writing an "H" command through a TTL port of the potential setting module, the potential setting module can generate the TTL high level signal and transmit to the adjustor for controlling the generation of the pulse drive signal of the adjustor. This step is optional. In other embodiments of the present invention, the pulse drive signal may be directly produced by the adjustor.

After step S450, the method further comprises the following steps:

A step a) is displaying the output level of the switch port of the switch power supply by a potential displaying module.

When the output voltage of the output module is equal to the preset voltage, the output level of the switch port of the switch power supply will be inverted from the high level to the low level according to the comparison of the output level of the switch port and a threshold value. Now, the pulse drive signal stops being inputted, and the integrated chip stops the adjustment of the resistance. For example, if the output voltage of a pin PG0 of the protection control chip is zero, the protection control chip will stop the automatic adjustment of the output voltage. Namely the switch power supply will stop the automatic adjustment of the output voltage. Meanwhile, the switch port can transmit a signal to a display light of the adjustor or the potential displaying module for showing the finish of the automatic adjustment, and an ATE can be used to measure the output voltage of the switch port. In another embodiment, when reaching at a given time of finishing the automatic adjustment, the ATE can actively measure the output voltage of the switch port.

A step b) is judging whether the output level of the switch port is less than the threshold value, if yes, the step c) will be performed. If not, it will inform that the automatic adjustment of the output voltage of the switch power supply failed.

In the embodiment of the present invention, the threshold value is 0.4V. In other embodiments, the threshold value may be other values, which is determined by the different manufactures for the definition of the low level of the different switch power supplies.

When the output level of the switch port is a low level, such as 0V or 0.4V, this shows that the output voltage of the switch power supply has been successfully adjusted and the ATE can automatically judge the product to be qualified (or "PASS"). When the output level of the switch port is still a high level (e.g. the output level is greater than or equal to a threshold value) in the given time of finishing the automatic adjustment, this shows that the automatic adjustment of the output voltage of the switch power supply failed and the ATE can automatically judge the product to be unqualified (or "FAIL"). Namely, the switch power supply (i.e. the product) is bad, and then it needs the failure analysis, does not need the subsequent adjustment, and informs that the ATE should exit the testing process of the output voltage.

A step c) is informing that the adjustment of the output voltage of the switch power supply is successful and waiting for performing other electrical test processes.

After the output voltage of the switch power supply is automatically adjusted to reach the preset voltage, the ATE may continue to test other electrical functions of the switch power supply, such as voltage regulation, ripple, noise, efficiency, and dynamic. The whole process of automatically adjusting and testing the output voltage may be completed by the built-in program of the ATE. Therefore, the present invention can realize full automation of the whole process, save manpower on product manufacture, and greatly enhance productivity.

The following text will take two embodiments for describing the adjusting method of the output voltage of the switch power supply by the adjusting device.

In a first embodiment of the present invention, the potential setting module is disposed in the ATE, the adjustor is a testing tool, and the integrated chip (namely the protection control chip) is a DWA100N-A chip, which integrates the digital variable resistor. The preset voltage of the switch power supply is 12V. The input port of the switch power supply is a PSNONB port, which is connected to a fourth pin of the integrated chip shown in FIG. 3. The switch port is a PG0 port, which is connected to an eighteenth pin of the integrated chip shown in FIG. 3. The first output port of the output module of the switch power supply is connected to a thirteenth pin of the integrated chip shown in FIG. 3 and is electrically connected to the comparison module of the testing tool.

Figure 5:
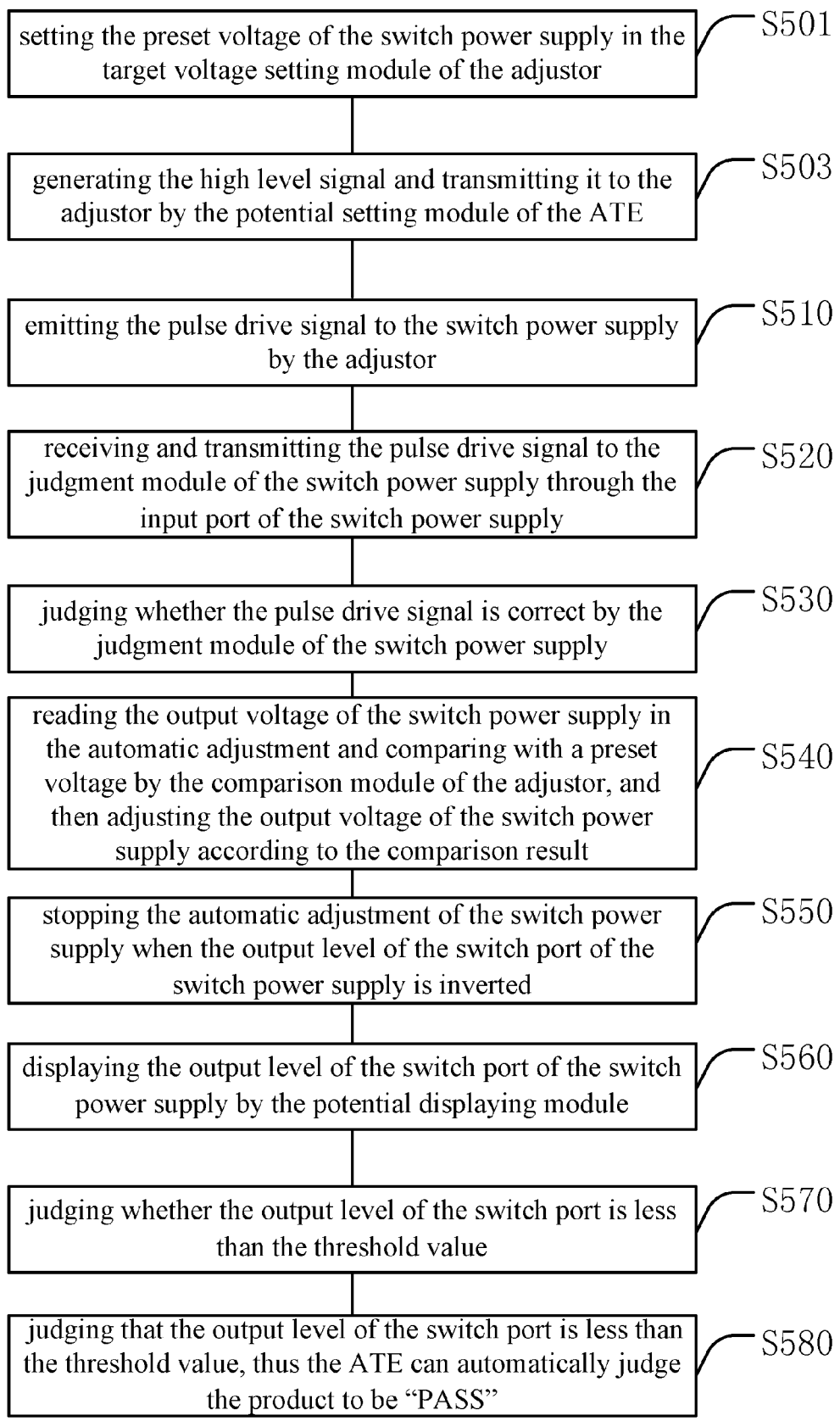
FIG. 5 is a flow chart illustrating the specific implementation of the adjusting method according to a first embodiment of the present invention.

Referring to FIG. 5, a step S501 is setting the preset voltage of the switch power supply in the target voltage setting module of the adjustor.

Here, the preset voltage is 12V.

A step S503 is generating the high level signal and transmitting it to the adjustor by the potential setting module of the ATE.

By writing the "H" command through the TTL port of the potential setting module, the potential setting module can generate the TTL high level signal and transmit it to the adjustor for controlling the generation of the pulse drive signal of the adjustor.

A step S510 is emitting the pulse drive signal to the switch power supply by the adjustor.

After generating the pulse drive signal, the pulse drive signal is transmitted to the PSONB port of the switch power supply.

A step S520 is receiving and transmitting the pulse drive signal to the judgment module of the switch power supply through the input port of the switch power supply.

Here, the input port is the PSONB port.

A step S530 is judging whether the pulse drive signal is correct by the judgment module of the switch power supply.

If the judgment module judges the pulse drive signal transmitted from the adjustor to be the three-square-waves pulse drive signal (namely a correct signal), the integrated chip built in the switch power supply will be driven to adjust the resistance, thereby automatically adjusting the output voltage of the switch power supply.

A step S540 is reading the output voltage of the switch power supply in the automatic adjustment and comparing with a preset voltage by the comparison module of the adjustor, and then adjusting the output voltage of the switch power supply according to the comparison result.

Namely, the comparison module reads the output voltage of the first output port of the output module of the switch power supply and compares the first output voltage with preset voltage. Meanwhile, the digital variable resistor of the integrated chip may vary the resistance thereof to further vary the output voltage of the first output port of the output module of the switch power supply.

A step S550 is stopping the automatic adjustment of the switch power supply when the output level of the switch port of the switch power supply is inverted.

When the output voltage of the output module is equal to the preset voltage set by the target voltage setting module, the triode of the comparison module will conduct electricity, the switch port (e.g. the PG0 port) will short circuit to ground, and the output level of the switch port will be inverted from the original high level to the low level.

A step S560 is displaying the output level of the switch port of the switch power supply by the potential displaying module.

After the potential displaying module of the ATE receives the information signal of the finish of the automatic adjustment, the ATE will measure and display the output voltage of the switch port of the switch power supply.

A step S570 is judging whether the output level of the switch port is less than the threshold value.

Here, the threshold value is 0.4V.

A step S580 is judging that the output level of the switch port is less than the threshold value, thus the ATE can automatically judge the product to be "PASS".

When judging the product to be "PASS", it shows that the adjustment of the output voltage of the switch power supply is successful and the product may wait for other electrical test processes.

In a second embodiment of the present invention, the potential setting module is disposed in the ATE, the adjustor is a testing tool, and the integrated chip (namely the housekeeping chip) is a DWA100N-A chip, which integrates the digital variable resistor. The preset voltage of the switch power supply is 5V. The input port of the switch power supply is a PSONB port, which is connected to a fourth pin of the integrated chip shown in FIG. 3. The switch port is a PG0 port, which is connected to an eighteenth pin of the integrated chip shown in FIG. 3. The second output port of the output module of the switch power supply is connected to a sixteenth pin of the integrated chip shown in FIG. 3 and is electrically connected to the comparison module of the adjustor.

Figure 6:
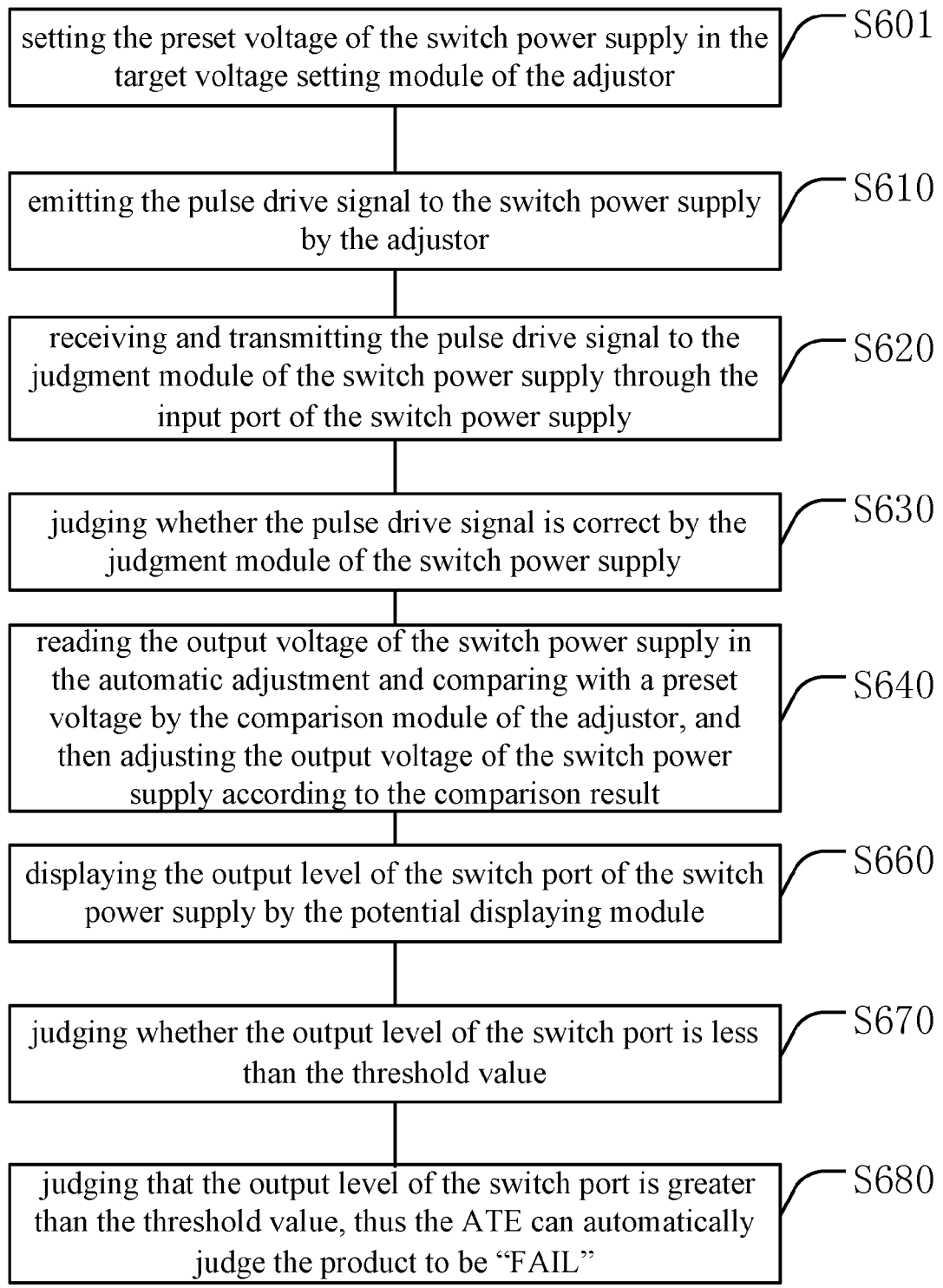
FIG. 6 is a flow chart illustrating the specific implementation of the adjusting method according to a second embodiment of the present invention.

Referring to FIG. 6, a step S601 is setting the preset voltage of the switch power supply in the target voltage setting module of the adjustor.

Here, the preset voltage is 5V. The adjustor directly generates the pulse drive signal.

A step S610 is emitting the pulse drive signal to the switch power supply by the adjustor.

After generating the pulse drive signal, the pulse drive signal is transmitted to the PSONB port of the switch power supply.

A step S620 is receiving and transmitting the pulse drive signal to the judgment module of the switch power supply through the input port of the switch power supply.

Here, the input port is the PSONB port.

A step S630 is judging whether the pulse drive signal is correct by the judgment module of the switch power supply.

If the judgment module judges the pulse drive signal transmitted from the adjustor to be the three-square-waves pulse drive signal, namely the pulse drive signal is a correct signal, the integrated chip built in the switch power supply will be driven to adjust the resistance, thereby automatically adjusting the output voltage of the switch power supply.

A step S640 is reading the output voltage of the switch power supply in the automatic adjustment and comparing with a preset voltage by the comparison module of the adjustor, and then adjusting the output voltage of the switch power supply according to the comparison result.

Namely, the comparison module reads the output voltage of the second output port of the output module of the switch power supply and compares the first output voltage with the preset voltage. Meanwhile, the digital variable resistor of the integrated chip may vary the resistance thereof to further vary the output voltage of the second output port of the output module of the switch power supply.

A step S660 is displaying the output level of the switch port of the switch power supply by the potential displaying module.

The potential displaying module will actively measure the voltage of the PG0 port of the switch power supply in a required finish time of the automatic adjustment of the ATE.

A step S670 is judging whether the output level of the switch port is less than the threshold value.

Here, the threshold value is 0.4V.

A step S680 is judging that the output level of the switch port is greater than the threshold value, thus the ATE can automatically judge the product to be "FAIL".

When judging the product to be "FAIL", it shows that the adjustment of the output voltage of the switch power supply failed, and then it needs to exit the test process of the output voltage and wait for the failure analysis.

Please refer to FIGS. 1, 2 and 3. The present invention also provides the integrated chip 133, which is disposed in the switch power supply 130. The integrated chip 133 further comprises a digital variable resistor 210, which is used to adjust the output voltage of the switch power supply 130 by varying the resistance thereof. The digital variable resistor 210 comprises multi-group parallel resistors, each group of which includes a resistor 211 and a fuse 213 in series. Namely, a first resistor is in series with a first fuse. Then the first resistor and the first fuse in series are in parallel with a second resistor and a second fuse in series, and then are in parallel with a third resistor and a third fuse in series, and so on. The output voltage of the traditional switch power supply is acquired by tuning the variable resistor to vary the resistance. In the specific embodiment of the present invention, the fuse 213 is employed to adjust the resistance. The fuse 213 has two states (e.g. fused and non-fused, namely disconnect and conduction), so the corresponding digital signal also has two states (e.g. 1 or 0). The more the parallel resistors of the digital variable resistor 210 are disposed, the more accurate the total equivalent resistance of the digital variable resistor 210 will become. Therefore, the output voltage of the switch power supply 130 has higher precision, and the product quality is greatly improved. In practice, first, it needs to set all of the multi-group parallel resistors of the digital variable resistor 210 to be all conducting electricity, now the total equivalent resistance of the digital variable resistor 210 will be relatively smaller and the output voltage of the switch power supply 130 will be larger. Meanwhile, the output voltage of the switch power supply 130 is set to be larger than the preset voltage, and next when adjusting the output voltage, the fuse 213 will be fused, the equivalent resistance of the digital variable resistor 210 will become larger, and the output voltage of the switch power supply 130 will become smaller. Hence the output voltage of the output module may be adjusted to gradually reach the preset voltage, thereby completing the automatic adjustment of the output voltage of the switch power supply 130.

The integrated chip 133 comprises the judgment module 134. The judgment module 134 is electrically connected to the input port 131 of the switch power supply 130 for receiving the pulse drive signal transmitted from the input port 131 and judging whether the pulse drive signal is correct. When the pulse drive signal is judged to be correct, the integrated chip 133 will start to adjust the resistor, thereby automatically adjusting the output voltage of the switch power supply 130. The integrated chip 133 is electrically connected to the comparison module 123 of the external adjustor 120 through the output module 135 of the switch power supply 130, thereby being capable of outputting the output voltage. The integrated chip 133 is electrically connected to the comparison module 123 of the adjustor 120 through the switch port 139 of the switch power supply 130. When the comparison module 123 judges that the output voltage of the switch power supply 130 is equal to the preset voltage, the output level of the switch port 139 will be inverted, and the automatic adjustment of the switch power supply 130 will be finished.

The present invention provides the adjusting device of the output voltage of the switch power supply, the adjusting method and the integrated chip. The adjusting device can produce a high level when testing the switch power supply, and drive the switch power supply to automatically adjust the output voltage by the adjustor. The present invention can achieve full automatic operation, save manpower on product manufacture, and greatly enhance productivity. Moreover, the integrated chip of the present invention employs the digital variable resistor to adjust the resistance, thereby enhancing the adjusting precision of the output voltage of the switch power supply and ensuring the product quality.

In conclusion, although the present invention has been disclosed by above preferred embodiments, above preferred embodiments are not used to limit the present invention. One of ordinary skills in the art also can make all sorts of improvements and amendments within the principles of the present invention. Therefore, the protection scope of the present invention should be based on the scope defined by the appended claims.

What is claimed is:

1. An adjusting device of an output voltage of a switch power supply, comprising:
    a potential setting module being used to generate a high level signal; and
    an adjustor being connected to the potential setting module and being used to receive the high level signal; and the adjustor comprising:
        a signal emitting module emitting a pulse drive signal to the switch power supply when receiving the high level signal; and
        a comparison module being used to read the output voltage of the switch power supply, compare with a preset voltage;
    wherein
        the switch power supply can stop the automatic adjustment when an output level of a switch port of the switch power supply is inverted, the switch power supply automatically adjusts the output voltage when receiving the pulse drive signal, and the adjustor adjusts the output voltage of the switch power supply according to a comparison result;
        the switch power supply further comprises an input port, an integrated chip and an output module;
        the input port being used to receive the pulse drive signal and then transmit to the integrated chip;
        the integrated chip is electrically connected to the input port and the output module, the integrated chip comprising a judgment module, which is used to judge whether the received pulse drive signal is correct;
        when the judgment module judges the received pulse drive signal to be correct, the switch power supply automatically adjusts the output voltage;
        when the judgment module judges the received pulse drive signal to be incorrect, the judgment module emits a warning signal to the adjustor for driving the adjustor to warn and enabling an amplifier of the adjustor to be opened; and
        the output module being connected to the comparison module for outputting the adjusted output voltage of the switch power supply.

2. The adjusting device of an output voltage of a switch power supply as claimed in claim 1, wherein the adjustor further comprises a target voltage setting module, which is used to set the preset voltage of the switch power supply for being read by the comparison module.

3. The adjusting device of an output voltage of a switch power supply as claimed in claim 1, wherein the switch port is electrically connected to the comparison module of the adjustor, when the comparison module judging that the output voltage of the switch power supply being equal to a preset voltage, the output level of the switch port being inverted.

4. The adjusting device of an output voltage of a switch power supply as claimed in claim 1, wherein the integrated chip further comprising a digital variable resistor, which is used to adjust the output voltage of the switch power supply by varying resistance thereof.

5. The adjusting device of an output voltage of a switch power supply as claimed in claim 4, wherein the digital variable resistor comprises multi-group parallel resistors, each group of which includes a resistor and a fuse in series.

6. An adjusting method of an output voltage of a switch power supply, comprising the following steps of:
    emitting a pulse drive signal to the switch power supply;
    receiving and transmitting the pulse drive signal to a judgment module of the switch power supply through an input port of the switch power supply;
    judging whether the pulse drive signal is correct by the judgment module; if correct, the switch power supply starting to automatically adjust the output voltage, and if incorrect, the judgment module emitting a warning signal to an adjustor for driving the adjustor to warn and enable an amplifier of the adjustor to be opened;
    reading the output voltage of the switch power supply in the automatic adjustment and comparing with a preset voltage by a comparison module of the adjustor, and then adjusting the output voltage of the switch power supply according to the comparison result by the adjustor; and
    stopping the automatic adjustment of the switch power supply when an output level of a switch port of the switch power supply being inverted.

7. The adjusting method as claimed in claim 6, before the step of emitting a pulse drive signal to the switch power supply, the adjusting method further comprises the following steps of:
    setting the preset voltage of the switch power supply in a target voltage setting module of the adjustor; and
    generating a high level signal and transmitting to the adjustor by a potential setting module.

8. The adjusting method as claimed in claim 6, after the step of stopping the automatic adjustment of the switch power supply, the adjusting method further comprises the following step of:
    informing that the adjustment of the output voltage of the switch power supply is successful and waiting for performing other electrical test processes when the output level of the switch port is less than a threshold value.

9. The adjusting method as claimed in claim 6, wherein the pulse drive signal ceases being input when the output level of the switch port of the switch power supply is inverted.

10. The adjusting method as claimed in claim 8, wherein the threshold value is 0.4V.

11. An integrated chip, which is disposed in a switch power supply, comprising:
   a digital variable resistor, being used to adjust an output voltage of the switch power supply by varying resistance thereof;
   wherein the integrated chip comprises a judgment module, which is electrically connected to an input port of the switch power supply for receiving a pulse drive signal transmitted from the input port and judging whether the pulse drive signal is correct; when the pulse drive signal is judged to be correct, the switch power supply starts to automatically adjust the output voltage; the integrated chip being electrically connected to a comparison module of an external adjustor through an output module of the switch power supply for outputting the output voltage of the switch power supply; and the integrated chip being electrically connected to the comparison module of the adjustor through a switch port of the switch power supply; when the comparison module judges that the output voltage of the switch power supply is equal to a preset voltage, an output level of the switch port is inverted; and when the judgment module judges the received pulse drive signal to be incorrect, the judgment module emits a warning signal to the adjustor for driving the adjustor to warn and enabling an amplifier of the adjustor to be opened.

* * * * *